United States Patent [19]

Trevison et al.

[11] Patent Number: 4,640,438

[45] Date of Patent: Feb. 3, 1987

[54] COVER FOR SEMICONDUCTOR DEVICE PACKAGES

[75] Inventors: Robert L. Trevison, Spokane, Wash.; William E. McKee, Coeur D'Alene, Id.; Larry B. Hunnel, Otis Orchards, Wash.

[73] Assignee: Comienco Limited

[21] Appl. No.: 840,225

[22] Filed: Mar. 17, 1986

[51] Int. Cl.⁴ ............................................. B65D 41/00
[52] U.S. Cl. ...................................... 220/359; 220/200; 174/52 S; 174/52 FF; 29/588
[58] Field of Search ............... 220/200, 359; 174/52 S, 174/52 FP, 66, 120; 156/89, 330; 29/588; 219/87, 91; 357/70, 74, 80

[56] References Cited

U.S. PATENT DOCUMENTS

| | | | |
|---|---|---|---|
| 3,823,468 | 7/1974 | Hascoe | 29/588 |
| 3,874,549 | 4/1975 | Hascoe | 220/200 |
| 3,946,190 | 3/1976 | Hascoe | 219/91 |
| 4,331,253 | 5/1982 | Gordon et al. | 220/200 |
| 4,331,258 | 5/1982 | Geschwind | 220/359 |
| 4,356,047 | 10/1982 | Gordon et al. | 156/89 |
| 4,560,084 | 12/1985 | Wolfson | 220/359 |

*Primary Examiner*—George T. Hall
*Attorney, Agent, or Firm*—Stevens, Davis, Miller & Mosher

[57] ABSTRACT

Covers for semiconductor packages are made by diffusion pressure bonding a coated substrate to a preform at a temperature below the melting point of the preform alloy. An alloy preform is coated on one side with a thin layer of the preform alloy component that has a lower melting point than the preform alloy, preferably the lowest melting point. Coated substrate and coated preform are assembled and the assembly is compressed and heated below the melting point of the preform alloy but above the melting point of the preform coating to form a diffusion pressure bond between substrate and preform.

19 Claims, 2 Drawing Figures

COVER FOR SEMICONDUCTOR DEVICE PACKAGES

BACKGROUND OF THE INVENTION

This invention relates to a cover and a method for making said cover for hermetically sealing packages for semiconductor devices.

Many packages for semiconductor devices consist of a metal housing and a cover sealed to the housing by means of a preform fused to housing and cover. The housing and cover are often made of iron-nickel or iron-nickel-cobalt alloys or KOVAR which are gold plated. The preform usually consists of a relatively low-melting solder alloy such as gold-tin, lead-indium-silver, lead-tin-silver, lead-tin, or tin-silver alloys. Such packages, covers and alloys are disclosed in U.S. Pat. Nos. 3,340,602, 3,367,756, 3,648,357, 3,823,468, 3,874,549, 3,946,190, 4,025,716, 4,328,921 and 4,331,253.

The package covers and methods for making covers disclosed in the prior art have a number of disadvantages. The bonding between the substrate of the cover and the preform may be incomplete, or discontinuous and often gives only 60% attachment. The bonding is generally carried out above the melting temperature of the preform alloy which tends to cause a deformation of the preform resulting in an irregular surface. An irregular surface, in turn, leads to difficulties when the cover is sealed to the package housing. It would, therefore, be an improvement if covers could be produced without the above-mentioned disadvantages. Such improvement could be realized when temperatures used in bonding of the preform to the substrate can be kept below the melting point of the preform. This has been partly realized as disclosed in U.S. Pat. No. 4,328,921. According to this disclosure, the gold-tin or lead-indium-silver alloy preform is only melted partly while being attached to the substrate. This method, however, still imparts an undesirable degree of deformation. According to U.S. Pat. No. 4,332,341, preforms made from alloys of tin, lead and silver are bonded to device contacts of a titanium-palladium-gold alloy by heating the preform to a temperature below the melting point of the solder while sufficient force is applied to produce a bond while the solid is kept in a solid phase. According to U.S. Pat. No. 3,935,986, certain metals such as copper and silver are bonded by arranging an interliner between a first and a second layer, the interliner having a melting point between those of the layers and being heat-diffusible to form an alloy with at least one of the layers, pressure bonding interliner and layers to form a composite and post bonding heating the composite above the melting point of the interliner and below that of the alloy for sufficient time to initiate diffusion and solidify the new alloy. This method has the disadvantages of a two-step process, i.e., first pressure bonding the layers and then heating the composite, and of forming a new alloy. These patents do not disclose the bonding of preforms to covers for semiconductor packages. It has also been suggested in U.S. Pat. No. 3,367,756 that gold-tin alloy foil be bonded to a gold-clad KOVAR substrate by rolling at 260° C. but the foil must first be leached in order to establish a good bond. It is stated in this disclosure that experiments with pressure bonding with and without heating were unsuccessful.

SUMMARY OF THE INVENTION

We have found that the attachment of a solder preform to a semiconductor package cover or lid can be improved by placing a very thin layer of a pure, low melting metal, which is one of the preform alloy constituents, as a bonding agent or bonding enhancer between the substrate of the cover and the solder preform. The bond is formed at a slight pressure and at a temperature above or close to the melting point of the thin metal layer but below that of the preform alloy. The bond so formed is a diffusion pressure bond that is continuous and so strong that the preform is destroyed before it can be peeled off.

In accordance with the invention, there is provided a method for making a cover for a semiconductor package which cover consists of a substrate made of a substrate alloy and having a substrate coating, and a preform made of a preform alloy consisting of two or more preform alloy components attached to said substrate, said method comprising the steps of applying a thin coating of a preform alloy component with a melting point lower than the melting point of the preform alloy to one side of said preform to form a coated preform, placing the coated preform in intimate contact with the substrate such that the coating on the preform contacts said substrate coating to form an assembly, applying a pressure to the assembly to form a compressed assembly, said pressure being insufficient to form a bond between the coated preform and the substrate coating without heating, and heating the compressed assembly to a temperature below the melting temperature of the preform alloy but above the melting temperature of the coating on the preform for a period of time sufficient to form a diffusion pressure bond between the substrate and the preform.

The cover for a package for semiconductor devices comprises in its broad aspect a cover substrate having a coating on one side thereof selected from at least one of the group consisting of gold and nickel, and a preform made of an alloy selected from the group consisting of gold-tin alloys, lead-tin alloys, lead-indium alloys, tin-silver alloys, lead-indium-silver alloys and lead-tin-silver alloys, said preform having a coating on one side thereof of a preform alloy component having a melting point lower than the melting point of the preform alloy, said preform being diffusion pressure bonded to the cover substrate.

In various embodiments of the invention, the substrate is preferably made of iron-nickel alloys such as Alloy 42, or cobalt-iron-nickel alloys such as KOVAR. The substrate may be coated with a thin layer of gold or nickel or both. The preforms can be made of alloys of gold-tin, lead-tin, lead-indium, tin-silver, lead-indium-silver or lead-tin-silver, as well as other suitable alloys. The preform alloys must have a composition with a melting point above that of a lower or the lowest melting point preform alloy component.

In a preferred embodiment, the substrate is made of KOVAR and the preform is made of gold-tin alloy. The KOVAR has a coating of nickel and a coating of gold over the nickel coating. The preform is made of gold-tin alloy having a composition somewhat below the eutectic composition of 20% tin and the preform has a coating of tin. The assembly of substrate and coated preform is placed in alignment under pressure in a furnace and in the presence of hydrogen and is heated for a time sufficient to form a diffusion pressure bond between substrate and preform, at least a portion of the gold coating on the KOVAR substrate, the tin coating on the preform and the preform alloy diffusing into each other to yield a composition of substantially eutectic composition.

DESCRIPTION OF THE PREFERRED EMBODIMENTS

Figure 1:
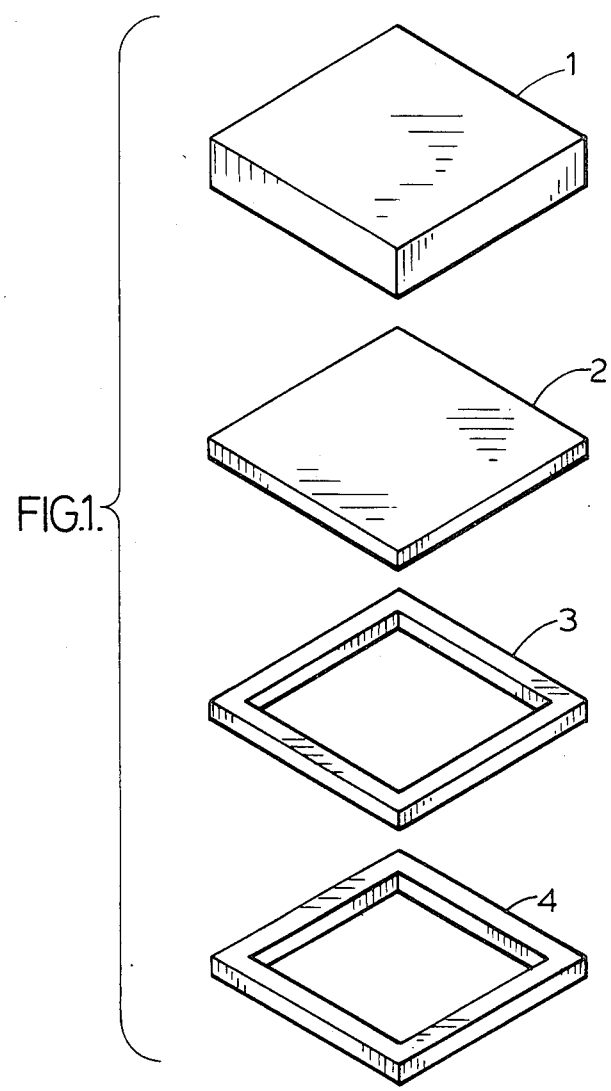
FIG. 1 is an exploded perspective view of the cover in its component parts.

In the fabrication of packages for semiconductor devices, a housing containing a semiconductor die is covered with a cover, which is sealed onto the housing by means of a peripheral solder preform. The cover is usually prefabricated by attaching the preform to the cover substrate. It is important that the bond between preform and substrate is continuous, strong and impervious. Suitable materials for cover substrates are iron-nickel alloys such as, for example, Alloy 42, and iron-nickel-cobalt alloys such as, for example, KOVAR. If desired, the substrate may be coated, for example, with a thin layer of gold. In order to increase corrosion resistance, the substrate may also be coated, usually by plating, with a thin layer of nickel. Alternatively, the substrate may be coated with a thin first layer of nickel and a thin second layer of gold. In preferred embodiments, the substrate is coated with gold, or with gold over nickel. The thickness of the substrate and the covering layers is usually specified by the manufacturer of semiconductor components. For example the substrate may have a thickness of 0.010 inch while each coating may have a thickness in the range of 50 to 300 microinches, preferably in the range of about 100 to 200 microinches.

The preforms, usually in the shape of a rectangular frame, often square, can be made of a number of alloys that have a relatively low melting point and consist of two or more alloy components. Suitable alloys are those which contain metals such as lead, tin, bismuth, antimony, indium, zinc, silver and gold and wherein at least one component of the preform alloy has a melting point lower than that of the preform alloy. Specific alloys used for preforms are gold-tin alloys containing 10 to 25% tin, particularly the gold—20% tin eutectic alloy with a melting point of 280° C., certain lead-tin-alloys containing high lead contents, a lead—50% indium alloy with a melting point of 210° C., a tin—4% silver alloy, a lead—5% indium—2.5% silver alloy with a melting point of 307° C., and lead-tin-silver alloys containing 1 to 10% tin and 1 to 4% silver, e.g., lead—1.5% silver—1% tin with a melting point of 309°0 C. Preform alloys suitable for use in the present invention must have a composition with a melting point above the melting point of at least one preform alloy component. Preforms are punched out of or stamped from thin sheets of alloy in the shape of a squarely-shaped or rectangularly-shaped frame. The size and shape of the preform is such that its outside perimeter matches and is contiguous with the periphery of the cover substrate. The thickness of the preform may, for example, be 0.002 inch.

In the method of the invention, a sheet of preform alloy is rolled to the desired thickness, the thin sheet of preform alloy is degreased and cleaned by a detergent, solvent process, or etching and the cleaned sheet of preform alloy is coated on one side with a thin coating of a component of the preform alloy. The component used has a lower melting point than the alloy and, preferably, is the component with the lowest melting point of the the preform alloy components. Of the above specifically named alloys, the coating for the preform is either tin or indium, as applicable. The coating is applied by methods such as roll cladding, vacuum vapor depostion or sputtering in an amount to yield a coating with an even thickness in the range of about 25 to 50 microinches. The preforms are subsequently stamped or punched from the coated preform alloy sheet.

With reference to FIG. 1, the components of the cover of the present invention consist of a cover substrate 1, a substrate coating 2, a preform coating 3 and a preform 4. A described above, substrate coating 2 may comprise either a layer of gold, or nickel or a first layer of nickel and a second layer of gold covering the first layer of nickel.

The coated substrate and the coated preform are brought into intimate contact such that substrate coating 2 contacts preform coating 3 to form an assembly with the peripheries of substrate and coated preform in contiguous alignment. The assembly of coated substrate and coated preform is placed in a suitable frame, clamp, and jig wherein the assembly is put under a pressure to form a compressed assembly. The pressure is sufficient to provide intimate contact between coated substrate and coated preform but is not so high, i.e. is insufficient, so as to create a bond without heating. The pressure is preferably in the range of about 20 to 30 inch pounds. Below about 20 inch pounds pressure, separation of layers occurs after heating to obtain the diffusion pressure bond, while above about 30 inch pounds pressure, deformation of edges occurs. In a preferred embodiment, the jig comprises a 90° V-shaped elongated body adapted to hold one assembly or a multiplicity of assemblies, a compression block at each extremity of the elongated V-shaped body adapted to move toward each other onto the at least one assembly, and means to apply a pressure to the assembly. Pressure is usually applied by turning end screw(s) onto the compression block(s). Compression blocks have the same dimensions as the assembly. To prevent accidental bonding of assemblies to each other, an inert spacer may be placed between assemblies. Suitable spacers, of the same dimensions as a substrate, are made of unplated KOVAR or unplated Alloy 42. The jig loaded with the one compressed assembly or the multiplicity of compressed assemblies is placed in a furnace and heated to a desired predetermined temperature to effect diffusion pressure bonding. If desired, the bonding may be carried out in the presence of an inert gas to avoid oxidation. The use of hydrogen as inert gas is advantageous where any oxide present can be reduced.

The furnace is heated to the predetermined temperature. The predetermined temperature of the diffusion pressure bonding must be maintained below the melting temperature of the preform alloy but, in order to establish a good bond, should be above the melting point of the metal forming the coating 3 on the preform 4. For example, when diffusion bonding a tin-coated gold-tin eutectic alloy preform to a substrate, the temperature is preferably controlled at a value in the range of from about 232° to 279° C. and preferably at about 260° C.

Figure 2:
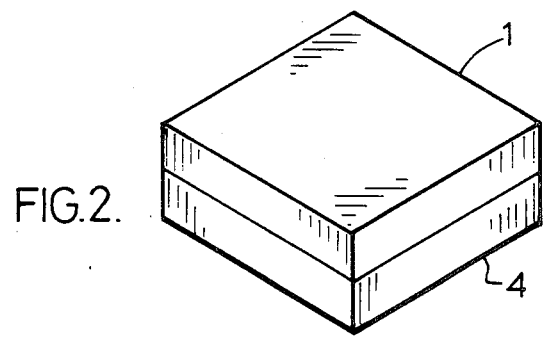
FIG. 2 is a perspective view of the cover in assembled form.

The predetermined temperature is maintained for a suitable time sufficient to cause the diffusion pressure bond between substrate and preform to form. Times sufficient to form a satisfactory diffusion pressure bond can be as short as ten minutes. Adequate times are generally in the range of about 15 to 120 minutes, usually in the range of about 30 to 60 minutes. The preform coating 3 melts and diffuses into the preform 4 and into at least a portion of the gold of the substrate coating 2, substrate coating 2, preform coating 3 and preform 4 forming the integral composition of a diffusion pressure bond. After the diffusion pressure bond is formed, the furnace is cooled, the jig is removed from the furnace and the diffusion bonded assemblies recovered as covers. A cover so produced is shown in FIG. 2 and upon inspection can be seen to consist of substantially two layers, namely, the substrate 1 and the preform 4, the preform coating 3 having essentially diffused into the substrate coating 2 and the preform 4, and the preform is now integral with the substrate.

In some applications, i.e. with certain preform alloys, the amount of coating applied to the preform is critical. For example, in the case of using gold-tin eutectic alloy for the preform, the cover produced by the method of the invention should have a composition for the preform attached to the substrate which corresponds closely with the eutectic composition of gold—20% tin. To achieve substantially eutectic composition, the alloy from which preforms are stamped should contain somewhat less than 20% Sn, e.g. about 19% Sn. The tin coating applied to the alloy sheet in the thickness of between 25 and 50 microinches then provides a coated preform that together with at least a portion of a gold coating on the substrate with a thickness in the range of about 50 to 300 microinches gives a cover assembly which has a diffusion pressure bonded preform that has a composition of substantially the eutectic composition. Although illustrated specifically for gold-tin eutectic alloy preforms, it is understood that the procedure can be similarly applied in cases of other preforms made from other alloys.

The method according to the invention has a number of advantages. The attachment of lids to preforms by bonding can be readily automated. Bonding can be carried out in a jig wherein a multiplicity of assemblies can be accurately aligned and bonded while being held in the jig. Temperature control is less critical than in prior art methods. The bond is uniformly complete and continuous around the entire periphery of a cover, and preform and substrate are integral, eliminating any chance of contamination being lodged under the preform after bonding. The bond is stronger than with covers of the prior art and there is little or no deformation of the preform.

The invention will now be illustrated by the following non-limitative example.

EXAMPLE 1

A preform alloy sheet consisting of AU—19% Sn alloy having a thickness of 0.002 inch was evaporation-coated on one side with a 50 microinch thick coating of high-purity tin. Frame-shaped preforms were punched from the coated preform alloy sheet. A substrate alloy of KOVAR was plated with a 200 microinch thick layer of pure gold. A multiplicity of coated substrates and coated preforms were aligned and assembled in the 90° V-shaped jig as described. Each tin-coated side of a preform was placed facing toward a gold-plated substrate. Between each assembly of a preform and substrate was inserted a spacer of unplated KOVAR substrate of the same size as the gold-plated substrate to prevent accidental bonding of the pure gold of the plated substrate to the non-coated side of the preform of an adjacent assembly upon heating. The so assembled multiplicity of assemblies and spacers were clamped in the jig with a pressure of 30 inch pounds that ensured intimate contact between each assembly of the coated substrate and coated preform and maintained the contiguous alignment of the peripheries of each coated substrate and coated preform. This pressure was insufficient to provide a permanent bond between substrate and preform without heating. The loaded jig was placed in a vacuum furnace. The furnace was evacuated to a pressure of $10^{-5}$ Torr and backfilled with hydrogen. The furnace was heated to 260° C. and this temperature was controlled and maintained for 30 minutes. After this time, the furnace was cooled, the jig was removed and the covers recovered. The covers were inspected and showed to consist essentially of a layer of the gold-tin eutectic alloy containing from 19.9 to 20.1% tin on the KOVAR substrate. The bond was continuous and could not be broken without damaging the preform.

The invention has been described in detail with particular reference to preferred embodiments thereof, but it will be understood that variations and modifications can be effected within the spirit and scope of the invention as described hereinabove.

We claim:

1. A method for making a cover for a semiconductor package, which cover consists of a substrate made of a substrate alloy and having a substrate coating, and a preform made of a preform alloy consisting of two or more preform alloy components attached to said substrate, said method comprising the steps of applying a thin coating of a preform alloy component with a melting point lower than the melting point of the preform alloy to one side of said preform to form a coated preform, placing the coated preform in intimate contact with the substrate such that the coating on the preform contacts said substrate coating to form an assembly, applying a pressure to the assembly to form a compressed assembly, said pressure being insufficient to form a bond between the coated preform and the substrate coating without heating, and heating the compressed assembly to a temperature below the melting temperature of the preform alloy but above the melting temperature of the coating on the preform for a period of time sufficient to form a diffusion pressure bond between the substrate and the preform.

2. A method as claimed in claim 1, wherein the pressure is in the range of about 20 to 30 inch pounds.

3. A method as claimed in claim 1, wherein the period of time is in the range of about 10 to 120 minutes.

4. A method as claimed in claim 3, wherein the period of time is in the range of about 30 to 60 minutes.

5. A method as claimed in claim 1, wherein said heating is conducted in the presence of an inert gas.

6. A method as claimed in claim 1, wherein the coating on the preform has a thickness in the range of about 25 to 50 microinches.

7. A method as claimed in claim 1, wherein the substrate alloy is an alloy chosen from the group consisting of iron-nickel alloys, cobalt-iron-nickel alloys, Alloy 42 and KOVAR.

8. A method as claimed in claim 1, wherein the preform alloy is an alloy chosen from the group consisting of gold-tin alloys, lead-tin alloys, lead-indium alloys, tin-silver alloys, lead-indium-silver alloys and lead-tin-silver alloys, said alloys having a composition with a melting point above the melting point of at least one preform alloy component.

9. A method as claimed in claim 8, wherein the preform is coated with a thin coating of the preform alloy component that has the lowest melting point of the components of the preform alloy.

10. A method as claimed in claim 1, wherein the substrate alloy is KOVAR, the preform alloy is a gold-tin alloy and the preform alloy is coated with a thin layer of tin.

11. A method as claimed in claim 1, wherein the substrate alloy is KOVAR, the substrate has a coating of gold, having a thickness in the range of about 50 to 300 microinches, the preform alloy is a gold-tin alloy containing about 20% tin and the preform alloy has a coating of tin, said coating of tin having a thickness in the range of about 25 to 50 microinches.

12. A method as claimed in claim 11, wherein the assembly is heated at a temperature controlled at about 260° C.

13. A method as claimed in claim 11, wherein the preform alloy is a gold-tin alloy containing about 19% tin, the preform alloy has a coating of tin having a thickness in the range of about 25 to 50 microinches, the substrate coating of gold has a thickness in the range of about 100 to 200 microinches and the thickness of the coating of tin and the thickness of the substrate coating are sufficient to form a diffusion pressure bond between at least a portion of the substrate coating of gold on the substrate, the coating of tin on the preform and the preform alloy, so that the composition of the preform after forming the diffusion pressure bond is a substantially eutectic composition containing about 20% tin.

14. A cover for a package for semiconductor devices comprising: a cover substrate having a coating on one side thereof selected from at least one of the group consisting of gold and nickel, and a preform made of an alloy selected from the group consisting of gold-tin alloys, lead-tin alloys, lead-indium alloys, tin-silver alloys, lead-indium-silver alloys and lead-tin-silver alloys, said preform having a coating on one side thereof of a preform alloy component having a melting point lower than the melting point of the preform alloy, said preform being diffusion pressure bonded to the cover substrate.

15. A cover as claimed in claim 14 wherein said substrate is an alloy selected from the group consisting of iron-nickel alloys, cobalt-iron-nickel alloys, Alloy 42 and KOVAR.

16. A cover as claimed in claim 15, wherein said substrate has a coating of gold having a thickness in the range of about 50 to 300 microinches, said preform alloy is a gold-tin alloy containing about 19% tin, and said coating on one side of the preform is tin having a thickness in the range of about 25 to 50 microinches prior to diffusion pressure bonding of the preform to the cover, to produce a preform having a substantially eutectic composition containing about 20% tin.

17. A cover as claimed in claim 16 for hermetically sealing a package for semiconductor devices wherein said preform is a rectangularly shaped frame contiguous with the periphery of the cover substrate.

18. A cover as claimed in claim 14 wherein said preform has been diffusion pressure bonded to the cover substrate by placing the coated preform in intimate contact with the substrate such that the coating on the preform contacts said substrate coating to form an assembly, applying a pressure to the assembly to form a compressed assembly, said pressure being insufficient to form a bond between the coated preform and the substrate coating without heating, and heating the compressed assembly to a temperature below the melting temperature of the preform alloy but above the melting temperature of the coating on the preform for a period of time sufficient to form a diffusion pressure bond between the substrate and the preform.

19. A cover for a package for semiconductor devices comprising: a cover substrate having a gold coating on one side thereof and a preform made of a gold-tin alloy having a coating of tin thereon diffusion pressure bonded to the cover substrate.

* * * * *

UNITED STATES PATENT AND TRADEMARK OFFICE
CERTIFICATE OF CORRECTION

PATENT NO. : 4,640,438

DATED : February 3, 1987

INVENTOR(S) : Robert L. TREVISON, et al

It is certified that error appears in the above-identified patent and that said Letters Patent is hereby corrected as shown below:

On the title page item [73] the Assignee information should read:

Assignee: --COMINCO LTD.--

Signed and Sealed this

Seventeenth Day of November, 1992

*Attest:*

DOUGLAS B. COMER

*Attesting Officer*     *Acting Commissioner of Patents and Trademarks*